United States Patent
Tsai et al.

(10) Patent No.: US 10,573,524 B2
(45) Date of Patent: Feb. 25, 2020

(54) METHOD OF CHEMICAL MECHANICAL POLISHING A SEMICONDUCTOR SUBSTRATE

(71) Applicant: Rohm and Haas Electronic Materials CMP Holdings, Inc., Newark, DE (US)

(72) Inventors: Wei-Wen Tsai, Taipei (TW); Cheng-Ping Lee, Miaoli County (TW); Jiun-Fang Wang, Hsinchu (TW)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 16/080,841

(22) PCT Filed: Mar. 4, 2016

(86) PCT No.: PCT/CN2016/075579
§ 371 (c)(1),
(2) Date: Aug. 29, 2018

(87) PCT Pub. No.: WO2017/147891
PCT Pub. Date: Sep. 8, 2017

(65) Prior Publication Data
US 2019/0057877 A1  Feb. 21, 2019

(51) Int. Cl.
*H01L 21/306* (2006.01)
*C09G 1/02* (2006.01)
*H01L 21/02* (2006.01)

(52) U.S. Cl.
CPC .......... *H01L 21/30625* (2013.01); *C09G 1/02* (2013.01); *H01L 21/02186* (2013.01)

(58) Field of Classification Search
None
See application file for complete search history.

(56) References Cited

U.S. PATENT DOCUMENTS

| | | | | |
|---|---|---|---|---|
| 7,820,068 B2 * | 10/2010 | Wang | ........................ | C09G 1/02 252/79.1 |
| 2003/0153184 A1 | 8/2003 | Wang et al. | | |
| 2003/0170991 A1 * | 9/2003 | Wang | ........................ | C09G 1/02 438/692 |
| 2004/0007690 A1 * | 1/2004 | Snider | .................... | B24B 19/226 252/79.1 |
| 2006/0141790 A1 * | 6/2006 | Kim | .......................... | C09G 1/02 438/691 |
| 2006/0226126 A1 * | 10/2006 | Zhou | ........................ | C09G 1/02 216/90 |
| 2007/0157524 A1 * | 7/2007 | Lortz | ........................ | C09G 1/02 51/298 |
| 2009/0078583 A1 * | 3/2009 | Kobata | ..................... | B23H 5/08 205/641 |
| 2015/0104941 A1 * | 4/2015 | Graham | ..................... | C09G 1/02 438/693 |
| 2017/0121560 A1 * | 5/2017 | Dockery | .................. | B24B 37/24 |

* cited by examiner

*Primary Examiner* — Shamim Ahmed
(74) *Attorney, Agent, or Firm* — Thomas S. Diebert; John J. Piskorski

(57) ABSTRACT

A process for chemical mechanical polishing a substrate containing titanium nitride and titanium is provided comprising: providing a polishing composition, containing, as initial components: water; an oxidizing agent; a linear polyalkylenimine polymer; a colloidal silica abrasive with a positive surface charge; a carboxylic acid; a source of ferric ions; and, optionally pH adjusting agent; wherein the polishing composition has a pH of 1 to 4; providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein at least some of the titanium nitride and at least some of the titanium is polished away with a selectivity between titanium nitride and titanium.

10 Claims, No Drawings

METHOD OF CHEMICAL MECHANICAL POLISHING A SEMICONDUCTOR SUBSTRATE

The present invention relates to the field of chemical mechanical polishing. In particular, the present invention is directed to a process for chemical mechanical polishing a substrate containing titanium nitride and titanium is provided comprising: providing a polishing composition, containing, as initial components: water; an oxidizing agent; a linear polyalkylenimine polymer; a colloidal silica abrasive with a positive surface charge; a carboxylic acid; a source of ferric ions; and, optionally pH adjusting agent; wherein the polishing composition has a pH of 1 to 4; providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein at least some of the titanium nitride and at least some of the titanium is polished away with a selectivity between titanium nitride and titanium.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

A composition and method for polishing one or more layers of a multilayer substrate that includes a first metal layer and a second layer is disclosed by Wang et al. in U.S. Pat. No. 6,867,140. Specifically, Wang et al. disclose a method for polishing one or more layers of a multi-layer substrate that includes a first metal layer and a second layer comprising: (i) contacting the first metal layer with a polishing system comprising: (a) a liquid carrier, (b) at least one oxidizing agent, (c) at least one carboxylic acid that increases the rate at which the system polishes at least one layer of the substrate, (d) polyethylenimine, (e) a polishing pad and/or an abrasive, and (ii) polishing the first metal layer with the system until at least a portion of the first metal layer is removed from the substrate.

Notwithstanding, there is a continuing need for new chemical mechanical polishing compositions exhibiting enhanced tungsten polishing rates and a removal rate selectivity for selectively removing titanium nitride features versus titanium features.

The present invention provides a method of polishing a substrate, comprising: providing the substrate, wherein the substrate has an exposed titanium nitride (TiN) feature and an exposed titanium (Ti) feature; providing a chemical mechanical polishing composition, comprising, as initial components: water; an oxidizing agent; a linear polyalkylenimine polymer; a colloidal silica abrasive having a positive surface charge; a carboxylic acid; a source of ferric ions; and, an optional pH adjusting agent; wherein the chemical mechanical polishing composition has a pH of 1 to 4; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the exposed titanium nitride (TiN) feature and at least some of the exposed titanium (Ti) feature are polished away from the substrate; and wherein the chemical mechanical polishing composition provided has a removal rate selectivity between the exposed titanium nitride (TiN) feature and the exposed titanium (Ti) feature is $\geq 100$.

The present invention provides a method of polishing a substrate, comprising: providing the substrate, wherein the substrate has an exposed titanium nitride (TiN) feature and an exposed titanium (Ti) feature; providing a chemical mechanical polishing composition, consisting of, as initial components: water; an oxidizing agent; a linear polyalkylenimine polymer; a colloidal silica abrasive having a positive surface charge; a carboxylic acid; a ferric nitrate (Fe(NO$_3$)$_3$); and, an optional pH adjusting agent; wherein the chemical mechanical polishing composition has a pH of 1 to 4; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the exposed titanium nitride (TiN) feature and at least some of the exposed titanium (Ti) feature are polished away from the substrate; and wherein the chemical mechanical polishing composition provided has a removal rate selectivity between the exposed titanium nitride (TiN) feature and the exposed titanium (Ti) feature is $\geq 100$.

DETAILED DESCRIPTION

The method of polishing a substrate of the present invention uses a chemical mechanical polishing composition containing a synergistic combination of a linear polyalkylenimine polymer and a colloidal silica abrasive having a positive surface charge at the system pH of 1 to 4. It has been surprisingly found that the synergistic combination of the linear polyalkylenimine polymer and the colloidal silica abrasive having a positive surface charge at the system pH of 1 to 4, provides for rapid removal of tungsten and titanium nitride while significantly reducing the removal of titanium.

Preferably, in the method of polishing a substrate of the present invention, comprises: providing the substrate, wherein the substrate has an exposed titanium nitride (TiN) feature and an exposed titanium (Ti) feature (preferably, wherein the substrate also has an exposed tungsten (W) feature); providing a chemical mechanical polishing composition, comprising (preferably, consisting of), as initial components: water; an oxidizing agent; a linear polyalkylenimine polymer; a colloidal silica abrasive having a positive surface charge; a carboxylic acid; a source of ferric ions (preferably, a ferric nitrate (Fe(NO$_3$)$_3$)); and, an optional pH adjusting agent; wherein the chemical mechanical polishing composition has a pH of 1 to 4 (preferably, 1.5 to 3; more preferably, 1.75 to 2.5; most preferably, 1.9 to 2.1); providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the exposed titanium nitride (TiN) feature and at least some of the exposed titanium (Ti) feature are polished away from the substrate; and wherein the chemical mechanical polishing composition provided has a removal rate selectivity between the exposed titanium nitride (TiN) feature and the exposed titanium (Ti) feature is ≥100.

Preferably, in the method of polishing a substrate of the present invention, the substrate provided has an exposed titanium nitride (TiN) feature and an exposed titanium (Ti) feature. More preferably, the substrate provided is a semiconductor substrate having at least one exposed titanium nitride (TiN) feature and at least one exposed titanium (Ti) feature. Most preferably, the substrate provided is a semiconductor substrate having an exposed tungsten feature, an exposed titanium nitride (TiN) feature and an exposed titanium (Ti) feature.

Preferably, in the method of polishing a substrate of the present invention, the water in the chemical mechanical polishing composition provided is at least one of deionized and distilled to limit incidental impurities.

Preferably, in the method of polishing a substrate of the present invention, the chemical mechanical polishing composition provided contains an oxidizing agent, wherein the oxidizing agent is selected from the group consisting of hydrogen peroxide (H$_2$O$_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizer is selected from hydrogen peroxide, perchlorate, perbromate; periodate, persulfate and peracetic acid. Most preferably, the oxidizing agent is hydrogen peroxide.

Preferably, in the method of polishing a substrate of the present invention, the chemical mechanical polishing composition provided contains 0.01 to 10 wt % (more preferably, 0.1 to 5 wt %; most preferably, 1 to 3 wt %) of an oxidizing agent.

Preferably, in the method of polishing a substrate of the present invention, the chemical mechanical polishing composition provided contains a linear polyalkylenimine polymer. More preferably, in the method of polishing a substrate of the present invention, the chemical mechanical polishing composition provided contains a linear polyalkylenimine polymer, wherein the linear polyalkylenimine polymer is a linear polyethylenimine polymer.

Preferably, in the method of polishing a substrate of the present invention, the chemical mechanical polishing composition provided contains a linear polyalkylenimine polymer, wherein the polyalkylenimine polymer has a number average molecular weight, $M_N$, of 500 to 100,000 (preferably, of 750 to 10,000; more preferably, 1,000 to 5,000; most preferably, 1,500 to 2,000) Daltons. More preferably, in the method of polishing a substrate of the present invention, the chemical mechanical polishing composition provided contains a linear polyalkylenimine polymer, wherein the linear polyalkylenimine polymer is a linear polyethylenimine polymer and wherein the linear polyethylenimine polymer has a number average molecular weight, $M_N$, of 500 to 100,000 (preferably, of 750 to 10,000; more preferably, 1,000 to 5,000; most preferably, 1,500 to 2,000) Daltons.

Preferably, in the method of polishing a substrate of the present invention, the chemical mechanical polishing composition provided contains 0.0005 to 0.1 wt % (more preferably, 0.001 to 0.03 wt %; most preferably, 0.0015 to 0.0025 wt %) of a linear polyalkylenimine polymer. More preferably, in the method of polishing a substrate of the present invention, the chemical mechanical polishing composition provided contains 0.0005 to 0.1 wt % (more preferably, 0.001 to 0.03 wt %; most preferably, 0.0015 to 0.0025 wt %) of a linear polyalkylenimine polymer; wherein the linear polyalkylenimine polymer is a linear polyethylenimine polymer. Most preferably, in the method of polishing a substrate of the present invention, the chemical mechanical polishing composition provided contains 0.0005 to 0.1 wt % (more preferably, 0.001 to 0.03 wt %; most preferably, 0.0015 to 0.0025 wt %) of a linear polyalkylenimine polymer; wherein the linear polyalkylenimine polymer is a linear polyethylenimine polymer; wherein the linear polyethylenimine polymer has a number average molecular weight, $M_N$, of 500 to 100,000 (preferably, of 750 to 10,000; more preferably, 1,000 to 5,000; most preferably, 1,500 to 2,000) Daltons.

Preferably, in the method of polishing a substrate of the present invention, the chemical mechanical polishing composition provided contains a colloidal silica abrasive having a positive surface charge, wherein the chemical mechanical polishing composition has a pH of 1 to 4 (more preferably, of 1.5 to 3; still more preferably, of 1.75 to 2.5; most preferably, of 1.9 to 2.1). More preferably, in the method of polishing a substrate of the present invention, the chemical mechanical polishing composition provided contains a colloidal silica abrasive having a positive surface charge, wherein the chemical mechanical polishing composition has a pH of 1 to 4 (more preferably, of 1.5 to 3; still more preferably, of 1.75 to 2.5; most preferably, of 1.9 to 2.1) as indicated by a zeta potential of >1 mV.

Preferably, in the method of polishing a substrate of the present invention, the chemical mechanical polishing composition provided contains a colloidal silica abrasive having a positive surface charge, wherein the colloidal silica abrasive has an average particle size ≤100 nm (preferably, 5 to 100 nm; more preferably, 10 to 60 nm; most preferably, 20 to 60 nm) as measured by dynamic light scattering techniques.

Preferably, in the method of polishing a substrate of the present invention, the chemical mechanical polishing composition provided contains 0.01 to 40 wt % (more preferably 0.1 to 10 wt %; most preferably, 0.5 to 1 wt %) of a colloidal silica abrasive having a positive surface charge.

Preferably, in the method of polishing a substrate of the present invention, the chemical mechanical polishing composition provided contains a carboxylic acid. Preferably, in the method of polishing a substrate of the present invention, the chemical mechanical polishing composition provided contains a carboxylic acid, wherein the carboxylic acid is selected from the group consisting of acetic acid; citric acid; ethyl acetoacetate; glycolic acid; lactic acid; malic acid; oxalic acid; salicylic acid; sodium diethyl dithiocarbamate; succinic acid; tartaric acid; thioglycolic acid; glycine; alanine; aspartic acid; malonic acid; gluteric acid; 3-hydroxybutyric acid; propionic acid; phthalic acid; isophthalic acid; 3-hydroxy salicylic acid; 3,5-dihydroxy salicylic acid; gallic acid; gluconic acid; tannic acid; salts; and, mixtures thereof. More preferably, in the method of polishing a substrate of the present invention, the chemical mechanical polishing composition provided contains a carboxylic acid, wherein the carboxylic acid is selected from the group consisting of acetic acid, citric acid, ethyl acetoacetate, glycolic acid, lactic acid, malic acid, malonic acid, succinic acid, oxalic acid and combinations thereof. Still more preferably, in the method of polishing a substrate of the present invention, the chemical mechanical polishing composition provided contains a carboxylic acid, wherein the carboxylic acid is selected from the group consisting of malonic acid and succinic acid. Most preferably, in the method of polishing a substrate of the present invention, the chemical mechanical polishing composition provided contains a carboxylic acid, wherein the carboxylic acid is malonic acid.

Preferably, in the method of polishing a substrate of the present invention, the chemical mechanical polishing composition provided contains 0.01 to 5 wt % (more preferably 0.05 to 1 wt %; most preferably, 0.1 to 0.5 wt %) of a carboxylic acid.

Preferably, in the method of polishing a substrate of the present invention, the chemical mechanical polishing composition provided contains a source of ferric ions. More preferably, in the method of the present invention, the chemical mechanical polishing composition provided contains a source of ferric ions, wherein the source of ferric ions is selected from the group consisting iron (III) salts. Most preferably, in the method of the present invention, the chemical mechanical polishing composition provided contains a source of ferric ions, wherein the source of ferric ions is ferric nitrate ($Fe(NO_3)_3$).

Preferably, in the method of polishing a substrate of the present invention, the chemical mechanical polishing composition provided contains 0.001 to 1 wt % (more preferably 0.01 to 0.1 wt %; most preferably, 0.03 to 0.05 wt %) of a source of ferric ions. More preferably, in the method of polishing a substrate of the present invention, the chemical mechanical polishing composition provided contains 0.001 to 1 wt % (more preferably 0.01 to 0.1 wt %; most preferably, 0.03 to 0.05 wt %) of ferric nitrate ($Fe(NO_3)_3$).

Preferably, in the method of polishing a substrate of the present invention, the chemical mechanical polishing composition provided has a pH of 1 to 4. More preferably, in the method of polishing a substrate of the present invention, the chemical mechanical polishing composition provided has a pH of 1.5 to 3. Still more preferably, in the method of polishing a substrate of the present invention, the chemical mechanical polishing composition provided has a pH of 1.75 to 2.5. Most preferably, in the method of polishing a substrate of the present invention, the chemical mechanical polishing composition provided has a pH of 1.9 to 2.1.

Preferably, in the method of polishing a substrate of the present invention, the chemical mechanical polishing composition provided optionally contains a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is an inorganic base. Most preferably, the pH adjusting agent is potassium hydroxide.

Preferably, in the method of polishing a substrate of the present invention, the chemical mechanical polishing pad provided can by any suitable polishing pad known in the art. One of ordinary skill in the art will know to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

Preferably, in the method of polishing a substrate of the present invention, wherein the chemical mechanical polishing composition provided has a tungsten removal rate of $\geq 1,500$ Å/min. More preferably, in the method of polishing a substrate of the present invention, the substrate provided has an exposed tungsten feature, wherein the chemical mechanical polishing composition provided has a tungsten removal rate of $\geq 1,500$ Å/min, with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

Preferably, in the method of polishing a substrate of the present invention, the substrate provided has an exposed tungsten feature, wherein the chemical mechanical polishing composition provided has a tungsten removal rate of $\geq 1,500$ Å/min; wherein the chemical mechanical polishing composition provided has a titanium removal rate of $\leq 24$ Å/min and wherein the chemical mechanical polishing composition provided has a titanium nitride removal rate of $\geq 2,400$ Å/min. More preferably, in the method of polishing a substrate of the present invention, the substrate provided has an exposed tungsten feature, wherein the chemical mechanical polishing composition provided has a tungsten removal rate of $\geq 1,500$ Å/min, a titanium removal rate of $\leq 24$ Å/min and a titanium nitride removal rate of $\geq 2,400$ Å/min, with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

Preferably, in the method of polishing a substrate of the present invention, the substrate provided has an exposed tungsten feature, wherein the chemical mechanical polishing composition provided has a tungsten removal rate of ≥1,500 Å/min; wherein the chemical mechanical polishing composition provided has a titanium removal rate of ≤23 Å/min and wherein the chemical mechanical polishing composition provided has a titanium nitride removal rate of ≥2,500 Å/min. More preferably, in the method of polishing a substrate of the present invention, the substrate provided has an exposed tungsten feature, wherein the chemical mechanical polishing composition provided has a tungsten removal rate of ≥1,500 Å/min, a titanium removal rate of ≤23 Å/min and a titanium nitride removal rate of ≥2,500 Å/min, with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

Some embodiments of the present invention will now be described in detail in the following Examples.

Comparative Examples C1-C5 and Example 1

Chemical Mechanical Polishing Composition Preparation

The chemical mechanical polishing compositions of Comparative Examples C1-C5 and Example 1 were prepared by combining the components in the amounts listed in TABLE 1 with the balance being deionized water and adjusting the pH of the compositions to the final pH listed in TABLE 1 with potassium hydroxide.

TABLE 1

| Ex # | Abrasive I* (wt %) | Abrasive II** (wt %) | Fe(NO$_3$)$_3$ (ppm) | Malonic acid (ppm) | PEI (ppm) | H$_2$O$_2$ (wt %) | pH |
|---|---|---|---|---|---|---|---|
| C1 | — | 0.2 | 362 | 1320 | — | 2 | 2.3 |
| C2 | — | 0.6 | 362 | 1320 | — | 2 | 2.3 |
| C3 | 2 | — | 362 | 1320 | — | 2 | 2.3 |
| C4 | 3 | — | 362 | 1320 | — | 2 | 2.3 |
| C5 | 3 | — | 362 | 1320 | 20 | 2 | 2.3 |
| 1 | — | 0.6 | 362 | 1320 | 20 | 2 | 2.3 |

*Abrasive I—Klebosol ™ II 1598-B25 slurry manufactured by AZ Electronic Materials, available from The Dow Chemical Company.
**Abrasive II—Colloidal silica abrasive having a positive surface charge.

Comparative Examples PC1-PC5 and Example P1

Chemical Mechanical Polishing Removal Rate Experiments

Removal rate polishing tests were performed in Comparative Examples PC1-PC5 and Example P1 using the chemical mechanical polishing compositions prepared according to Comparative Examples C1-C5 and Example 1, respectively. The polishing removal rate experiments were performed on 200 mm blanket wafers installed on an Applied Materials 200 mm Mirra® polishing machine. The polishing removal rate experiments were performed on 200 mm blanket 1 k tetraethylorthosilicate (TEOS) sheet wafers from SEMATECH SVTC, tungsten (W) blanket wafers available from SEMATECH SVTC, titanium (Ti) blanket wafers available from SEMATECH SVTC and titanium nitride (TiN) blanket wafers available from SEMATECH SVTC. All polishing experiments were performed using an IC1010™ polyurethane polishing pad paired with an SP2310 subpad (commercially available from Rohm and Haas Electronic Materials CMP Inc.) with a down force of 21.4 kPa (3.1 psi), a chemical mechanical polishing composition flow rate of 125 mL/min, a table rotation speed of 80 rpm and a carrier rotation speed of 81 rpm for a 60 second polishing period. A diamond pad conditioner PDA33A-D (commercially available from Kinik Company) was used to condition the polishing pad. The polishing pad was broken in with the conditioner using a conditioning down force of 9 lbs (4.1 kg) for 15 minutes followed by a conditioning down force of 7 lbs (3.18 kg) for an additional 15 minutes. The polishing pad was further conditioned ex situ prior to polishing using a down force of 7 lbs (3.18 kg) for 24 seconds between polish experiments. The TEOS removal rates were determined by measuring the film thickness before and after polishing using a KLA-Tencor FX200 metrology tool. The tungsten (W), titanium (Ti) and titanium nitride (TiN) removal rages were determined using a Jordan Valley JVX-5200T metrology tool. The results of the removal rate experiments are provided in TABLE 2.

TABLE 2

| Ex # | Slurry Composition | W (Å/min) | Ti (Å/min) | TiN (Å/min) | TEOS (Å/min) |
|---|---|---|---|---|---|
| PC1 | Comp. Ex. C1 | 1871 | — | — | 110 |
| PC2 | Comp. Ex. C2 | 3431 | 1165 | 3184 | 506 |
| PC3 | Comp. Ex. C3 | 1664 | — | — | 247 |
| PC4 | Comp. Ex. C4 | 1845 | 1400 | 2480 | 337 |
| PC5 | Comp. Ex. C5 | 1465 | 1041 | 2044 | 310 |
| P1 | Ex. 1 | 1669 | 22 | 2540 | 393 |

We claim:
1. A method of polishing a substrate, comprising:
providing the substrate, wherein the substrate has an exposed titanium nitride (TiN) feature and an exposed titanium (Ti) feature;
providing a chemical mechanical polishing composition, consisting of, as initial components:
water;
an oxidizing agent;
a linear polyalkylenimine polymer;
a colloidal silica abrasive having a positive surface charge;
a carboxylic acid;
a source of ferric ions; and,
an optional pH adjusting agent;
wherein the chemical mechanical polishing composition has a pH of 1 to 4;
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate;

wherein at least some of the exposed titanium nitride (TiN) feature and at least some of the exposed titanium (Ti) feature are polished away from the substrate; and wherein the chemical mechanical polishing composition provided has a removal rate selectivity between the exposed titanium nitride (TiN) feature and the exposed titanium (Ti) feature is ≥100.

2. The method of claim 1, wherein the substrate also has an exposed tungsten feature; wherein at least some of the exposed tungsten feature is polished away.

3. The method of claim 2, wherein the chemical mechanical polishing composition provided has a tungsten removal rate of ≥1,500 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

4. The method of claim 3, wherein the chemical mechanical polishing composition provided has a titanium removal rate of ≤24 Å/min and a titanium nitride removal rate of ≥2,400 Å/min.

5. The method of claim 3, wherein the chemical mechanical polishing composition provided has a titanium removal rate of ≤23 Å/min and a titanium nitride removal rate of ≥2,500 Å/min.

6. The method of claim 1, wherein the chemical mechanical polishing composition provided, consists of, as initial components:
  the water;
  the oxidizing agent;
  the linear polyalkylenimine polymer;
  the colloidal silica abrasive;
  the carboxylic acid;
  the source of ferric ions, wherein the source of ferric ions is ferric nitrate; and,
  the optional pH adjusting agent.

7. The method of claim 6, wherein the substrate also has an exposed tungsten feature; wherein at least some of the exposed tungsten feature is polished away.

8. The method of claim 7, wherein the chemical mechanical polishing composition provided has a tungsten removal rate of ≥1,500 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

9. The method of claim 8, wherein the chemical mechanical polishing composition provided has a titanium removal rate of ≤24 Å/min and a titanium nitride removal rate of ≥2,400 Å/min.

10. The method of claim 8, wherein the chemical mechanical polishing composition provided has a titanium removal rate of ≤23 Å/min and a titanium nitride removal rate of ≥2,500 Å/min.

* * * * *